United States Patent [19]

Singer et al.

[11] 4,372,642
[45] Feb. 8, 1983

[54] MULTIPLE THIN FILM ABSORPTION OF REFLECTED SUBSTRATE MODES IN WAVEGUIDE SYSTEM

[75] Inventors: Arnold H. Singer; Ronald T. Holm, both of Alexandria, Va.

[73] Assignee: The United States of America as represented by the Secretary of the Navy, Washington, D.C.

[21] Appl. No.: 210,188

[22] Filed: Nov. 25, 1980

[51] Int. Cl.³ .............................................. G02B 5/174
[52] U.S. Cl. .................................. 350/96.12; 350/164
[58] Field of Search ................... 350/96.11, 96.12, 164, 350/166

[56] References Cited

U.S. PATENT DOCUMENTS

| | | | |
|---|---|---|---|
| 2,478,385 | 8/1949 | Gaiser | 350/164 |
| 3,761,160 | 9/1973 | Apfel et al. | 350/164 |
| 3,858,965 | 1/1975 | Sumita | 350/164 |
| 3,970,360 | 7/1976 | Kersten et al. | 350/96.12 X |
| 4,000,416 | 12/1976 | Goell | 455/612 |
| 4,006,964 | 2/1977 | Mahlein et al. | 350/96.12 X |
| 4,122,239 | 10/1978 | Riboulet et al. | 350/96.12 X |
| 4,139,262 | 2/1979 | Mahlein et al. | 350/96.33 |
| 4,141,621 | 2/1979 | Aagard et al. | 350/96.12 |
| 4,190,315 | 2/1980 | Brettle et al. | 350/96.12 |
| 4,279,464 | 7/1981 | Colombini | 350/96.11 X |
| 4,348,074 | 9/1982 | Burns et al. | 350/96.11 |

OTHER PUBLICATIONS

Anderson, "Integrated Optical Spectrum Analyzer: An Imminent 'Chip'" *IEEE Spectrum*, Dec. 1978, pp. 22-29.

Burns et al., "Applications of Ion Implantation to Int. Opt. Spectrum Analyzers," *Optics Letters*, vol. 5, No. 2, Feb. 1980, pp. 45-47.

*Primary Examiner*—John D. Lee
*Attorney, Agent, or Firm*—Robert F. Beers; William T. Ellis; Kenneth E. Walden

[57] ABSTRACT

Reduction of light reflections in substrate modes. The use of absorbing multilayer thin-film light interference coatings on the backside of a $LiNbO_3$ substrate provides an optical system which substantially reduces reflected substrate modes in integrated optical spectrum analyzers at around 8300 Å wavelength, or at other selected wavelengths, over a broad range of incident angles by selection of individual film thickness and optical constants.

21 Claims, 8 Drawing Figures

MULTIPLE THIN FILM ABSORPTION OF REFLECTED SUBSTRATE MODES IN WAVEGUIDE SYSTEM

BACKGROUND OF THE INVENTION

Thin-film light guides often consist of a transparent film of high refractive index deposited on a substrate having a lower refractive index. Such waveguides are commonly formed by diffusing titanium (Ti) into a lithium niobate ($LiNbO_3$) substrate. The in-diffused Ti guide can either take a wide planar form over the substrate or be confined to a narrow ribbon, in which case it tends to assume somewhat the characteristics of an optical fiber.

It has been calculated that a substantial portion of the light from a laser beam coupled into the waveguide is actually transmitted into the substrate, either at the coupling-in juncture or by leakage from the waveguide. These modes normally undergo total internal reflections in the substrate until reaching the coupling-out juncture, such as at a detector array. These reflected modes in Ti-diffused $LiNbO_3$ waveguide systems used in integrated optical spectrum analyzers present a serious noise problem.

It is proposed that absorbing layers formed on the backside of the substrate is a solution in suppressing substrate modes. These substrate modes can be attenuated by lossy interference stacks, referred to as dark-mirror coatings or black interference reflectors. But, in the past, such were designed to operate in air and absorb effectively at light incident normal thereto over a broad wavelength band in the visible range. Such a dark mirror coating for this purpose is illustrated schematically in drawing FIG. 3, to which later reference and explanation will be made. See U.S. Pat. Nos. 2,478,385; 3,761,160 and 3,858,965 for examples of anti-reflection coatings.

SUMMARY OF THE INVENTION

In contrast to prior dark mirror coatings, which are adapted to function over a broad wavelength band at normal incidence to the surface, the present invention is adapted to function at substantially a single wavelength to absorb incident light over a broad range of angles of incidence.

The invention relates to the reduction of reflectance in substrates by using light-absorbing multi-layer thin-film interference coatings on the backside of Ti-diffused $LiNbO_3$ substrates. The multilayers are provided to substantially reduce reflected substrate modes in integrated optic systems at the wavelength of the laser light over a broad range of incident angles by selection of individual film thicknesses and refractive indices.

OBJECT OF THE INVENTION

An object of this invention is to provide an arrangement for absorbing light which has leaked into a substrate from an overlying thin-film waveguide.

Another object of this invention is to provide a multilayer thin-film coating of selected individual thicknesses and optical constants on the backside of a substrate of an integrated optical system for absorption of light in the substrate incident to the film over a wide range of angles.

Other objects of the invention will become apparent upon consideration of the specification, claims and accompanying drawings.

DESCRIPTION OF THE PREFERRED EMBODIMENTS

Figure 1:
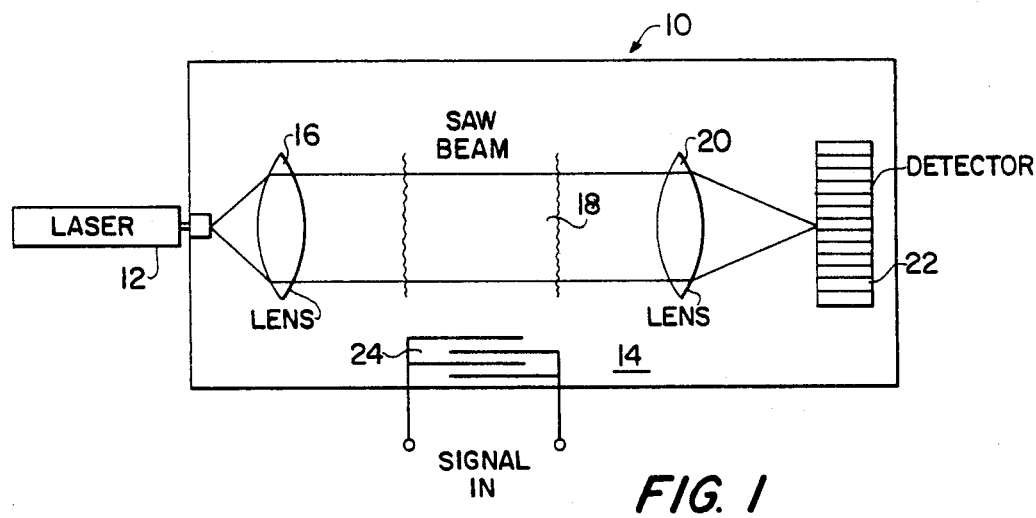
FIG. 1 is a plan view of a waveguide system in which the present invention is adaptable for use.

Referring now to the drawings and initially to FIG. 1, there is illustrated in partial block form some of the essential elements making up an integrated optical system 10 in which the present invention is adaptable for use. Light from a source such as laser 12 is coupled into thin-film waveguide 14 and collimated by a first optical waveguide lens 16 to travel across span 18 of the waveguide after which it is focused by a second optical waveguide lens 20 onto a detector 22. Information in the form of an input signal may be applied to a transducer 24 which transmits it as an acoustical wave transversely across span 18 to produce periodic perturbations in the waveguide effective refractive index. The now diffracted light passes through lens 20 and onto the detector in a manner whereby the input signal is represented.

Figure 2:
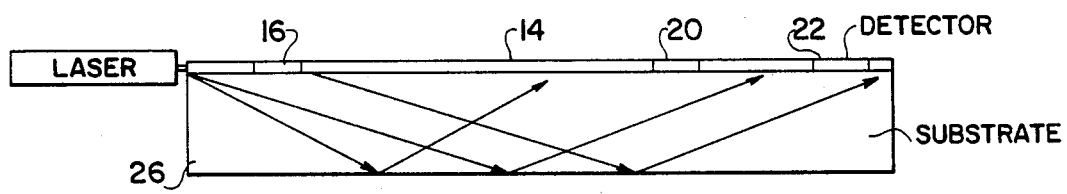
FIG. 2 is a cross-sectional view of FIG. 1 illustrating substrate modes including their reflection from the backside of an uncoated substrate.

As previously mentioned in the background information, a substantial amount of light may find its way into the waveguide substrate, either at the coupling or by leakage from the film waveguide. This is illustrated in FIG. 2 where light leaked from laser 12 or from waveguide 14 into substrate 26 is reflected at its air-facing backside. These reflected modes tend to interfere with light being coupled out of the waveguide at detector 22.

Figure 3:
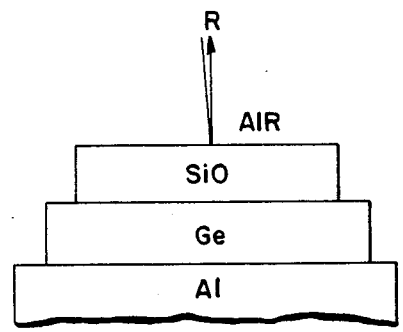
FIG. 3 is a side view representation of a prior art dark mirror coating for attenuating or absorbing light from air at near normal incidence.

A typical dark mirror coating known in the prior art is illustrated in FIG. 3. It consists of an aluminum (Al) substrate first coated with an absorbing film of germanium (Ge) and finally with a transparent layer of silicon oxide (SiO). While this typical dark mirror coating is concerned with absorbing incident light generally normal to the coating over a wide range of wavelengths, the present invention is provided to operate effectively at a single wavelength with light incident from the substrate over a broad range of angles.

Figure 4:
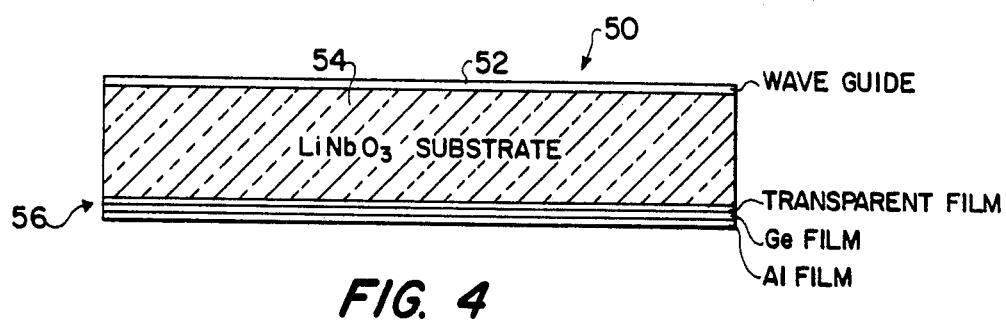
FIG. 4 is a sectional view through a waveguide and substrate with multilayer thin-films according to this invention provided on the backside of the substrate.

FIG. 4 is a cross-sectional view of an optical waveguide system 50 comprising a thin-film waveguide 52 and an underlying substrate 54 of $LiNbO_3$, the backside of which is covered with an antireflecting multilayer thin-film coating designated generally by the number 56. The layers are applied to the substrate with critical attention given to the thickness and optical constants of each individual layer. A complete multilayer coating may consist of as many layers as necessary to maximize absorption of incident light and minimize reflection.

Figure 5:
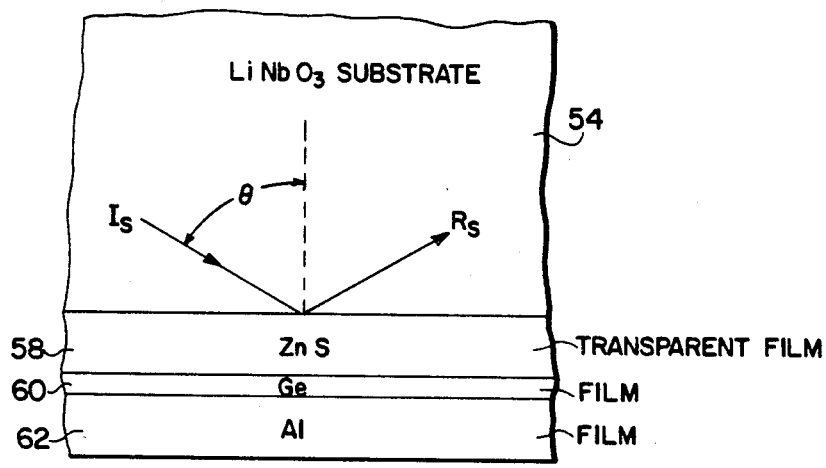
FIG. 5 is an enlarged cross sectional view of a portion of FIG. 4 illustrating incident light an angle $\theta$ and the beam which is reflected from the interface.

FIG. 5 schematically illustrates the absorption of a substrate mode at an angle of incidence $\theta$ in the LiNbO$_3$ substrate. The substrate mode is s polarized with angles of incidence less than or up to the largest angle of incidence expected as determined by designed substrate dimensions (length and thickness). Length is defined as the distance between the laser and detector. In the present application this maximum angle of incidence is 76°. When such a substrate 54 faces air (no coating) on its backside, substrate modes with an angle of incidence greater than 27° are totally reflected back into the substrate. The purpose of the dark mirror coating 56, as illustrated in FIGS. 4 and 5, is to first couple the reflected light modes out of the LiNbO$_3$ substrate and then absorb them. To prevent total reflection at the LiNbO$_3$ film interface at the largest expected angle of incidence, which in the present application is 76°, the first transparent film must have an index of refraction larger than that calculated according to the formula $n_t = n_s \sin \theta_m$, where $n_s$ is the index of refraction of the substrate and $\theta_m$ is the maximum angle of incidence.

The reflectance for s polarization was calculated using a conventional multilayer formula which accounts for all multiple reflected beams in all films. In s polarization the electric field of the light is perpendicular to the plane of incidence. The set of films selected for s polarization would not perform properly for p polarization. Therefore, it would be necessary to recalculate to determine a new set of film thicknesses appropriate for p polarization.

To determine the theoretical effectiveness of dark mirror coating 56, it was necessary to calculate the substrate mode reflectance $R_s$ at the operating wavelength of 8300 Å as a function of $\theta$ for a series of values greater than 2.11 for the index $n_t$ of the transparent first film 58 immediately adjacent the substrate, as illustrated in FIGS. 4 and 5. Aluminum layer 62 was assumed to be opaque. The following values were used for the optical constants of LiNbO$_3$, Ge, and Al at $\lambda = 8300$ Å.

| MATERIAL | OPTICAL CONSTANT |
|---|---|
| LiNbO$_3$ | n = 2.17, k = 0 |
| Ge | n = 5.24, k = .81 |
| Al | n = 2.06, k = 7.1 |

For each value of $n_t$ (transparent film 58), the thicknesses $d_t$ and $d_{Ge}$ of the transparent film and the germanium (Ge) film, respectively, were adjusted to minimize $R_s$ at $\theta = 70°$. With these values of $d_t$ and $d_{Ge}$, $R_s$ was plotted versus $\theta$.

Figure 6A:
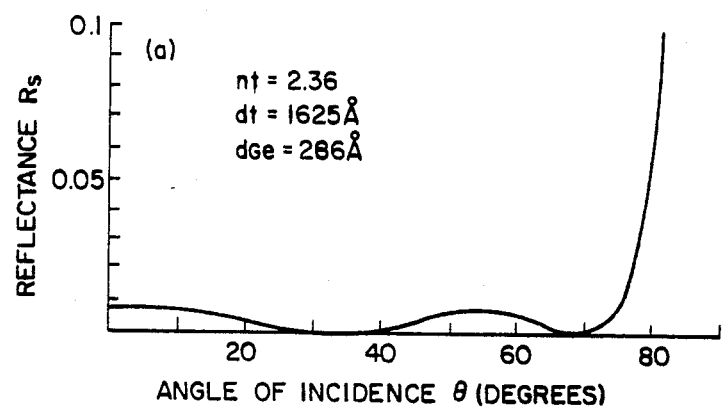
FIG. 6a is a first graph illustrating calculation results based on a transparent film of index 2.36 next to the substrate giving lowest overall reflectance.
Figure 6B:
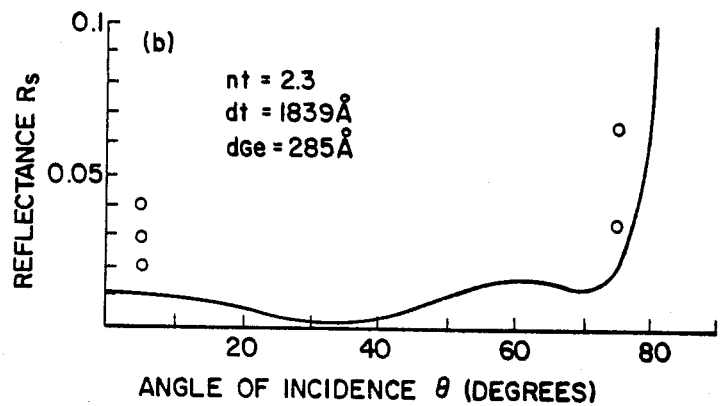
FIG. 6b is a second graph similar to FIG. 6a illustrating calculations based on zinc sulfide as the transparent film next to the substrate.
Figure 6C:
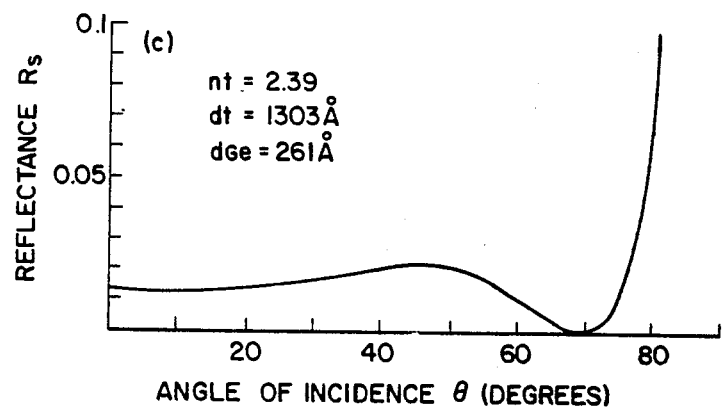
FIG. 6c is a third graph similar to FIGS. 6a and 6b based on the transparent film being cadmium sulfide.

It was determined that a value of 2.36 for $n_t$ gave the lowest overall reflectance. For this value of $n_t$, $R_s$ has two minima that are essentially zero at $\theta = 34°$ and 70°, and does not exceed 1% over the angle range from 0° to 75°. This is illustrated in the graph of FIG. 6a. Zinc sulfide (ZnS) having an n of 2.3, cerium dioxide (CeO$_2$) having an n of 2.13–2.37 and cadmium sulfide having an n of 2.39 were candidates for possible selection. The graph in FIG. 6b shows $R_s$ for $n_t = 2.3$. The graph in FIG. 6c shows $R_s$ for $n_t = 2.39$. As can be seen by comparing the results in FIGS. 6b and 6c, $R_s$ is somewhat larger in each than in FIG. 6a, but still less than 2.5% for any $\theta$ less than 76°. ZnS was chosen for the transparent first layer of multilayer coating 56.

FIG. 6b indicated that the ZnS and Ge thicknesses should be 1839 Å and 285 Å respectively. The ZnS film was vacuum evaporated at a pressure of $3 \times 10^{-5}$ Torr or better. The ZnS deposition was monitored at $\lambda = 8000$ Å because, at this wavelength, the required ZnS optical thickness is very near the one-half wavelength. The thickness of the ZnS film was measured and found to be $\sim 2000$ Å.

The Ge film deposition was monitored at $\lambda = 9000$ Å. Using the optical constants of n = 5.2, k = 0.6 for Ge for this wavelength, it was calculated that transmittance of a 285 Å Ge film on a glass slide (n = 1.5) should be $\sim 20\%$. However, it was found that better dark-mirror coatings were made when the Ge film transmittance was 30–33%. This corresponds to film thickness of $\sim 180$ Å with the constants of n = 5.2 and k = 0.6. A Ge second film was measured to be about 220 Å. This film was also vacuum evaporated in the same manner as the first film.

The third film layer is opaque Al applied over the Ge film by being vacuum exaporated at the pressure previously identified for the ZnS and Ge films. The Al film has an index of n = 2.06 and an extinction coefficient of k = 7.1, and any thickness which makes the Al appear opaque to the light (e.g., over about 400 Å) may be used.

Five coatings were produced to evaluate their effectiveness. Reflectance was measured at near normal incidence, i.e. $\theta = 5°$, from three of the coatings and at 76° from the other two. At 5° the reflectances were 2%, 3% and 4%. At 76° the reflectances were 3.5% and 6.5%. These values, indicated by small circles in FIG. 6b, are reasonably close to the theoretical curve.

Example Of Complete Antireflective Coating

An example of the antireflective coating for use on the backside of the substrate of an optical waveguide system is disclosed as follows. A substrate of LiNbO$_3$ had a Ti optical waveguide diffused into its frontside for carrying light therethrough. An antireflective coating comprising plural layers was provided on the backside of the substrate. The first layer of transparent material deposited on the substrate was ZnS, 1839 Å thick with an index of refraction of 2.30. The next or second layer deposited onto the first layer was a moderately lossy material, such as Ge. The Ge film had a thickness of 220 Å. The third layer was highly lossy and was deposited thick enough to be opaque. This third layer may be Al with a thickness over 400 Å. With these three coatings applied, light of nearly 8300 Å wavelength having leaked into the substrate and incident to the backside of the substrate and coating over a broad range of angles up to about 76° was substantially absorbed with minimal reflection.

There has been disclosed herein an arrangement of an antireflective multilayer coating on the backside of a substrate opposite a thin optical waveguide for absorbing leaked substrate modes and preventing their interference with normal detection of the waveguide light. More specifically, reflected substrate light can interfere with light being coupled out of the waveguide.

While the invention has been particularly shown and described with reference to specific embodiments, it will be understood that various changes in form and detail may be made therein without departing from the spirit and scope of the invention which is limited only by the claims appended hereto.

What is claimed and desired to be secured by Letters Patent of the United States is:

1. An optical waveguide system with reduced substrate reflections comprising:
   a substrate;
   a thin-film optical waveguide on the frontside of the substrate for carrying light therethrough; and
   an absorbing antireflective multilayer coating on the backside of the substrate;
   whereby light of substantially a single wavelength having leaked into the substrate and incident to the backside of the substrate over a broad range of angles is substantially absorbed by the antireflecting coating with minimal reflection.

2. The invention according to claim 1 where the broad range of incident angles varies from near normal up to about 76°.

3. The invention according to claim 1 wherein the substrate is LiNbO$_3$.

4. The invention according to claim 3 wherein the thin-film optical waveguide is defined by Ti diffused into the frontside of the LiNbO$_3$ substrate.

5. The invention according to claim 1, 3 or 4 wherein the absorbing antireflective multilayer coating includes a transparent first layer on the substrate and has an index of refraction greater than n, where n is calculated according to the formula $$n = n_s \sin \theta_m$$

where $n_s$ = index of refraction of the substrate, and $\theta_m$ = maximum angle of incidence; and, layers outward of the first layer are lossy.

6. The invention according to claim 5 wherein the first layer is ZnS.

7. The invention according to claim 5 wherein the lossy layers are progressively more lossy outwardly from the first layer.

8. The invention according to claim 5 or 7 wherein the first lossy layer has an extinction coefficient k < n.

9. The invention according to claim 8 wherein the second lossy layer outward of the first lossy layer has an extinction coefficient k > n.

10. The invention according to claim 9 where the value of k of the second lossy layer is over two times the value of n of the same layer.

11. The invention according to claim 7 or 10 wherein the first lossy layer and second lossy layer are Ge and Al, respectively.

12. An optical waveguide system with reduced substrate reflections comprising:
    a substrate;
    a thin-film optical waveguide on the frontside of the substrate for carrying light therethrough; and
    an absorbing antireflective coating on the backside of the substrate comprising:
      a first layer of transparent material;
      a second layer of material being moderately lossy; and
      a third layer of material being highly lossy;
    whereby light of substantially a single wavelength having leaked into the substrate and incident to the backside thereof over a broad range of angles is substantially absorbed with minimal reflection.

13. The invention according to claim 12 wherein the second layer material is semiconductor material.

14. The invention according to claim 13 wherein the second layer is Ge.

15. The invention according to claim 12 or 13 wherein the third layer material is metallic.

16. The invention according to claim 15 wherein the third layer is Al.

17. The invention according to claim 12 wherein the substrate is LiNbO$_3$.

18. The invention according to claim 17 wherein the optical waveguide is Ti diffused into the LiNbO$_3$ substrate.

19. The invention according to claim 12, 17 or 18 wherein the first layer of transparent material has an index of refraction $n_t$ where the value of $n_t$ is greater than that calculated according to the formula $n = n_s \sin \theta_m$, where $n_s$ = index of refraction of the substrate, and $\theta_m$ = maximum angle of incidence.

20. The invention according to claim 12 wherein the transparent material is ZnS.

21. The invention according to claim 12 wherein the first, second and third layers are ZnS, Ge and Al, respectively.

* * * * *